United States Patent
Ning et al.

(10) Patent No.: US 11,328,758 B2
(45) Date of Patent: May 10, 2022

(54) MAGNETIC MEMORY, AND PROGRAMMING CONTROL METHOD, READING METHOD, AND MAGNETIC STORAGE DEVICE OF THE MAGNETIC MEMORY

(71) Applicants: Semiconductor Manufacturing International (Shanghai) Corporation, Shanghai (CN); Semiconductor Manufacturing International (Beijing) Corporation, Beijing (CN)

(72) Inventors: Dan Ning, Shanghai (CN); Zi Jian Zhao, Shanghai (CN); Tao Wang, Shanghai (CN); Hao Ni, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/022,701

(22) Filed: Sep. 16, 2020

(65) Prior Publication Data
US 2021/0090630 A1 Mar. 25, 2021

(30) Foreign Application Priority Data
Sep. 20, 2019 (CN) .......................... 201910892676.9

(51) Int. Cl.
*G11C 11/16* (2006.01)
(52) U.S. Cl.
CPC ...... *G11C 11/1673* (2013.01); *G11C 11/1675* (2013.01)

(58) Field of Classification Search
CPC ......................... G11C 11/1673; G11C 11/1675
USPC .......................................................... 365/158
See application file for complete search history.

(56) References Cited

U.S. PATENT DOCUMENTS

| | | | |
|---|---|---|---|
| 10,726,896 B1 * | 7/2020 | Jacob | G11C 11/1675 |
| 2012/0218805 A1 * | 8/2012 | Kim | G11C 29/30 365/63 |
| 2013/0016553 A1 * | 1/2013 | Rao | G11C 13/004 365/158 |
| 2013/0265820 A1 * | 10/2013 | Chih | G11C 11/16 365/158 |
| 2013/0272059 A1 * | 10/2013 | Lin | G11C 29/74 365/158 |

(Continued)

*Primary Examiner* — Sung Il Cho
(74) *Attorney, Agent, or Firm* — Anova Law Group, PLLC

(57) ABSTRACT

A magnetic memory and its programming control method and reading method, and a magnetic storage device of the magnetic memory are provided in the present disclosure. The magnetic memory includes a first magnetic tunnel junction memory cell, including a first terminal coupled to a first bit line, and further includes a switch device, including a first terminal coupled to a second terminal of the first magnetic tunnel junction memory cell, and a control terminal connected to a switch control signal. The magnetic memory further includes a second magnetic tunnel junction memory cell, including a first terminal coupled to a second bit line, and a second terminal coupled to a second terminal of the switch device. The magnetic memory further includes a first transistor, a second transistor, and a sensing amplifier.

11 Claims, 5 Drawing Sheets

(56) References Cited

U.S. PATENT DOCUMENTS

| | | | |
|---|---|---|---|
| 2013/0322154 A1* | 12/2013 | Youn | G11C 7/062 |
| | | | 365/148 |
| 2016/0225427 A1* | 8/2016 | Chen | G11C 11/1675 |
| 2016/0372174 A1* | 12/2016 | Ohsawa | G11C 11/1693 |
| 2017/0103792 A1* | 4/2017 | Itai | G11C 11/1659 |
| 2017/0169873 A1* | 6/2017 | Appeltans | G11C 11/1657 |
| 2020/0043553 A1* | 2/2020 | Cline | H03K 19/1776 |
| 2020/0194048 A1* | 6/2020 | Roy | G11C 11/1673 |

\* cited by examiner

When writing 0, applying a positive voltage on the first bit line and a ground voltage on the second bit line — S401

At an initial programming stage, using the switch control signal to control the switch device to be in conduction and using the word line to control the first transistor and the second transistor to be in conduction, thereby switching the first magnetic tunnel junction memory cell into a low resistance state — S402

At a second programming stage, using the word line to control the first transistor and the second transistor to be cutoff, thereby switching the second magnetic tunnel junction memory cell into a high resistance state — S403

FIG. 4

When writing 1, applying a ground voltage on the first bit line and a positive voltage on the second bit line — S501

At an initial programming stage, using the switch control signal to control the switch device to be in conduction and using the word line to control the first transistor and the second transistor to be in conduction, thereby switching the first magnetic tunnel junction memory cell into a high resistance state — S502

At a second programming stage, using the word line to control the first transistor and the second transistor to be cutoff, thereby switching the second magnetic tunnel junction memory cell into a low resistance state — S503

FIG. 5

MAGNETIC MEMORY, AND PROGRAMMING CONTROL METHOD, READING METHOD, AND MAGNETIC STORAGE DEVICE OF THE MAGNETIC MEMORY

CROSS-REFERENCE TO RELATED APPLICATION

This application claims the priority of Chinese Patent Application No. 201910892676.9, filed on Sep. 20, 2019, the content of which is incorporated herein by reference in its entirety.

TECHNICAL FIELD

The present disclosure generally relates to the field of integrated circuits and, more particularly, relates to a magnetic memory, as well as a programming control method, a reading method, and a magnetic storage device of the magnetic memory.

BACKGROUND

Spin-transfer torque magnetic random-access memory (STT-MRAM) has the characteristics including fast read write speed, high density, low power consumption, and the like, compared with other conventional memory. Meanwhile, due to compatibility with advanced processes, STT-MRAM is expected to replace static random-access memory (SRAM), dynamic random-access memory (DRAM), flash memory and the like, to become widely used next-generation memory. As such, it is crucial to optimize STT-MRAM performance.

MRAM memory cells are manufactured using characteristics of material anisotropic magnetoresistance. Writing of the MRAM memory cells is performed by external magnetic field or spin transfer torque; and reading of the MRAM memory cells is performed by determining 0 and 1 signals according to the potential difference caused by different magnetic resistance. FIG. 1 illustrates a magnetic tunnel junction (MTJ) memory cell commonly used in MRAM. A common memory cell reading method is to use the potential difference between a selected cell and a reference cell, caused by different magnetoresistance, to read a signal through a sensing amplifier (SA).

However, due to limitations in material technology, existing MRAM memory cell has a low resistance value ratio between the low resistance state (having parallel magnetization) and high resistance state (having anti-parallel magnetization), which may affect the write and read performance. Furthermore, due to the limitations of disturbing, the MRAM read voltage needs to be controlled relatively low, such that a read current may be relatively small and read signal errors may be relatively large by comparing with the reference cell. In high performance applications, the performance of the memory cell may be degraded to a certain extent under high temperature and after performing multiple read and write operations, and the read and write errors may thus be more likely to occur.

SUMMARY

One aspect of the present disclosure provides a magnetic memory. The magnetic memory includes a first magnetic tunnel junction memory cell, including a first terminal coupled to a first bit line; a switch device, including a first terminal coupled to a second terminal of the first magnetic tunnel junction memory cell, and a control terminal connected to a switch control signal; a second magnetic tunnel junction memory cell, including a first terminal coupled to a second bit line, and a second terminal coupled to a second terminal of the switch device; a first transistor, including a first terminal coupled to the second terminal of the first magnetic tunnel junction memory cell, a second terminal coupled to a source line, and a control terminal coupled to a word line; a second transistor, including a first terminal coupled to the second terminal of the second magnetic tunnel junction memory cell, a second terminal coupled to the source line, and a control terminal coupled to the word line; and a sensing amplifier, including a first input terminal coupled to the first bit line, a second input terminal coupled to a second bit line, and an output terminal outputting a readout signal.

Optionally, the first terminals of the first magnetic tunnel junction memory cell and the second magnetic tunnel junction memory cell are free magnetization layers, and the second terminals of the first magnetic tunnel junction memory cell and the second magnetic tunnel junction memory cell are fixed magnetization layers.

Optionally, when writing 0 or 1, the first magnetic tunnel junction memory cell and the second magnetic tunnel junction memory cell have different resistance states.

Optionally, after writing 0, the first magnetic tunnel junction memory cell is in a low resistance state, and the second magnetic tunnel junction memory cell is in a high resistance state; and after writing 1, the first magnetic tunnel junction memory cell is in the high resistance state, and the second magnetic tunnel junction memory cell is in the low resistance state; or after writing 1, the first magnetic tunnel junction memory cell is in the low resistance state, and the second magnetic tunnel junction memory cell is in the high resistance state; and after writing 0, the first magnetic tunnel junction memory cell is in the high resistance state, and the second magnetic tunnel junction memory cell is in the low resistance state.

Optionally, the memory further includes a first charging capacitor, including a first terminal that is grounded, and a second terminal coupled to the first terminal of the first magnetic tunnel junction memory cell; and includes a second charging capacitor, including a first terminal that is grounded, and a second terminal coupled to the first terminal of the second magnetic tunnel junction memory cell.

Optionally, the first terminals of the first magnetic tunnel junction memory cell and the second magnetic tunnel junction memory cell are fixed magnetization layers, and the second terminals of the first magnetic tunnel junction memory cell and the second magnetic tunnel junction memory cell are free magnetization layers.

Optionally, each of the first transistor and the second transistor is a metal-oxide-semiconductor transistor.

Another aspect of the present disclosure includes a programming control method based on the magnetic memory. The programming control method includes when writing 0, applying a positive voltage on the first bit line and a ground voltage on the second bit line; at an initial programming stage, using the switch control signal to control the switch device to be in conduction and using the word line to control the first transistor and the second transistor to be in conduction, thereby switching the first magnetic tunnel junction memory cell into a low resistance state; and at a second programming stage, using the word line to control the first transistor and the second transistor to be cutoff, thereby switching the second magnetic tunnel junction memory cell into a high resistance state.

Another aspect of the present disclosure includes a programming control method based on the magnetic memory. The programming control method includes when writing 1, applying a ground voltage on the first bit line and a positive voltage on the second bit line; at an initial programming stage, using the switch control signal to control the switch device to be in conduction and using the word line to control the first transistor and the second transistor to be in conduction, thereby switching the first magnetic tunnel junction memory cell into a high resistance state; and at a second programming stage, using the word line to control the first transistor and the second transistor to be cutoff, thereby switching the second magnetic tunnel junction memory cell into a low resistance state.

Another aspect of the present disclosure includes a reading method based on the magnetic memory. The reading method includes charging the first bit line and the second bit line; using the switch control signal to control the switch device to be cutoff; and using the word line to control the first transistor and the second transistor to be in conduction, where a readout signal of the sensing amplifier varies with different voltage differences between a voltage of the first bit line and a voltage of the second bit line.

Another aspect of the present disclosure includes a magnetic storage device, including a magnetic memory. The magnetic memory includes a first magnetic tunnel junction memory cell, including a first terminal coupled to a first bit line; a switch device, including a first terminal coupled to a second terminal of the first magnetic tunnel junction memory cell, and a control terminal connected to a switch control signal; a second magnetic tunnel junction memory cell, including a first terminal coupled to a second bit line, and a second terminal coupled to a second terminal of the switch device; a first transistor, including a first terminal coupled to the second terminal of the first magnetic tunnel junction memory cell, a second terminal coupled to a source line, and a control terminal coupled to a word line; a second transistor, including a first terminal coupled to the second terminal of the second magnetic tunnel junction memory cell, a second terminal coupled to the source line, and a control terminal coupled to the word line; and a sensing amplifier, including a first input terminal coupled to the first bit line, a second input terminal coupled to a second bit line, and an output terminal outputting a readout signal. The magnetic storage device further includes a controller, configured to execute steps of a programming control method and steps of a reading method of the magnetic memory.

Other aspects of the present disclosure can be understood by those skilled in the art in light of the description, the claims, and the drawings of the present disclosure.

Compared with the existing technology, it can be seen that the technical solutions provided by the present disclosure may achieve at least the following beneficial effects.

The magnetic memory of the technical solutions provided by the present disclosure may include a first magnetic tunnel junction memory cell and a second magnetic tunnel junction memory cell. Through different resistance states (high resistance state or low resistance state) of the first magnetic tunnel junction memory cell and the second magnetic tunnel junction memory cell, writing and reading 0 and 1 may be implemented, and the comparison of the resistance values of a single magnetic tunnel junction memory cell in the low resistance state and the high resistance state may be avoided. Therefore, the influence of a relatively low resistance value ratio on the reading performance may be avoided, and the reading accuracy and speed of the magnetic memory may be improved. Furthermore, the magnetic memory may include a first transistor and a second transistor. When programming the first magnetic tunnel junction memory cell, the first transistor and the second transistor may be in conduction, and the current flowing through the first magnetic tunnel junction memory cell may increase, thereby improving the programming capability of the magnetic tunnel junction memory cell.

BRIEF DESCRIPTION OF THE DRAWINGS

The following drawings are merely examples for illustrative purposes according to various disclosed embodiments and are not intended to limit the scope of the present disclosure.

FIG. 4 illustrates a flow chart of a programming control method according to various disclosed embodiments of the present disclosure;

FIG. 5 illustrates a flow chart of another programming control method according to various disclosed embodiments of the present disclosure;

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The magnetic memory of the technical solution of the present disclosure may include a first magnetic tunnel junction memory cell and a second magnetic tunnel junction memory cell. Through different resistance states (high resistance state or low resistance state) of the first magnetic tunnel junction memory cell and the second magnetic tunnel junction memory cell, writing and reading 0 and 1 may be implemented, and the comparison of the resistance values of a single magnetic tunnel junction memory cell in the low resistance state and the high resistance state may be avoided. Therefore, the influence of a relatively low resistance value ratio on the reading performance may be avoided, and the reading accuracy and speed of the magnetic memory may be improved. Furthermore, the magnetic memory may include a first transistor and a second transistor. When programming the first magnetic tunnel junction memory cell, the first transistor and the second transistor may be in conduction, and the current flowing through the first magnetic tunnel junction memory cell may increase, thereby improving the programming capability of the magnetic tunnel junction memory cell.

Figure 2:
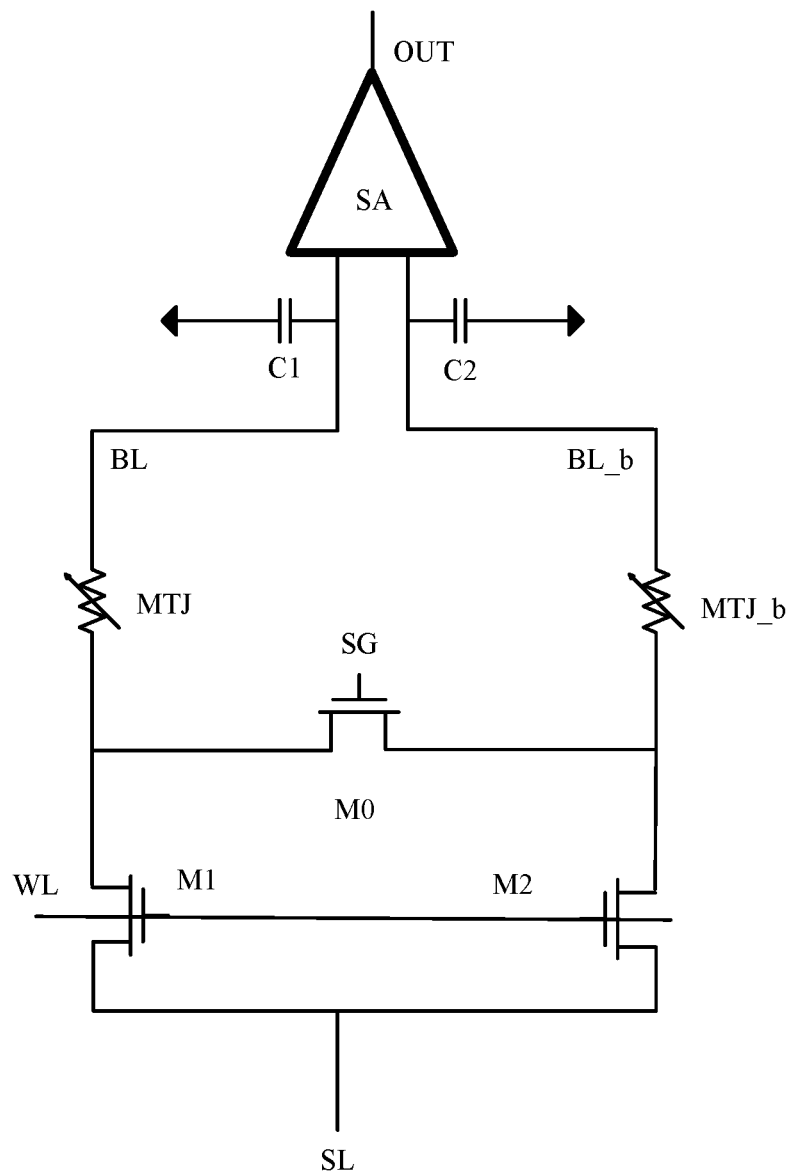
FIG. 2 illustrates a circuit structural diagram of a magnetic memory according to various disclosed embodiments of the present disclosure.

FIG. 2 illustrates a circuit structural diagram of a magnetic memory according to various disclosed embodiments of the present disclosure.

Referring to FIG. 2, the magnetic memory may include a first magnetic tunnel junction memory cell MTJ, a second magnetic tunnel junction memory cell MTJ_b, a switch device M0, a first transistor M1, a second transistor M2, and a sensing amplifier SA.

The first terminal of the first magnetic tunnel junction memory cell MTJ may be coupled to a first bit line BL. The first terminal of the switch device M0 may be coupled to the second terminal of the first magnetic tunnel junction memory cell MTJ, and the control terminal of the switch device M0 may be connected to a switch control signal SG. The first terminal of the second magnetic tunnel junction memory cell MTJ_b may be coupled to a second bit line BL_b, and the second terminal of the second magnetic tunnel junction memory cell MTJ_b may be coupled to the second terminal of the switch device M0.

For example, the switch device M0 may be a metal-oxide-semiconductor (MOS) transistor. The type of the switch device M0 may be configured according to actual application environment, which may not be limited according to the embodiments of the present disclosure.

In unlimiting embodiments of the present disclosure, the first terminals of the first magnetic tunnel junction memory cell MTJ and the second magnetic tunnel junction memory cell MTJ_b may be free magnetization layers, and the second terminals of the first magnetic tunnel junction memory cell MTJ and the second magnetic tunnel junction memory cell MTJ_b may be fixed magnetization layers.

For example, the change of the resistance states of the first magnetic tunnel junction memory cell MTJ and the second magnetic tunnel junction memory cell MTJ_b may be achieved by the inversion of the free magnetization layer. For example, if the current direction is from the free magnetization layer to the fixed magnetization layer, the magnetic tunnel junction memory cell may be switched to the low resistance state; conversely, if the current direction is from the fixed magnetization layer to the free magnetization layer, the magnetic tunnel junction memory cell may be switched to the high resistance state.

In the subsequent programming process, the current flowing through the first magnetic tunnel junction memory cell MTJ may be from the first bit line BL to the switch device M0, and the current flowing through the second magnetic tunnel junction memory cell MTJ_b may be from the switch device M0 to the second bit line BL_b. In such case, in order to make the resistance states of the first magnetic tunnel junction memory cell MTJ and the second magnetic tunnel junction memory cell MTJ_b different after programming, it is necessary to set the positions of the fixed magnetization layers and the free magnetization layers for both memory cells. That is, it is necessary to set the first terminals of both memory cells to be the free magnetization layers and the second terminals of both memory cells to be the fixed magnetization layers.

In one optional embodiment, the first terminals of the first magnetic tunnel junction memory cell MTJ and the second magnetic tunnel junction memory cell MTJ_b may be fixed magnetization layers, and the second terminals of the first magnetic tunnel junction memory cell MTJ and the second magnetic tunnel junction memory cell MTJ_b may be free magnetization layers.

In unlimiting embodiments of the present disclosure, when writing 0 or 1, the first magnetic tunnel junction memory cell MTJ and the second magnetic tunnel junction memory cell MTJ_b may have different resistance states.

For example, after writing 0, the first magnetic tunnel junction memory cell MTJ may be in the low resistance state, and the second magnetic tunnel junction memory cell MTJ_b may be in the high resistance state; and after writing 1, the first magnetic tunnel junction memory cell MTJ may be in the high resistance state, and the second magnetic tunnel junction memory cell MTJ_b may be in the low resistance state. Or, after writing 1, the first magnetic tunnel junction memory cell MTJ may be in the low resistance state, and the second magnetic tunnel junction memory cell MTJ_b may be in the high resistance state; and after writing 0, the first magnetic tunnel junction memory cell MTJ may be in the high resistance state, and the second magnetic tunnel junction memory cell MTJ_b may be in the low resistance state.

Referring to FIG. 2, the first terminal of the first transistor M1 may be coupled to the second terminal of the first magnetic tunnel junction memory cell MTJ, the second terminal of the first transistor M1 may be coupled to a source line SL, and the control terminal of the first transistor M1 may be coupled to a word line WL. The first terminal of the second transistor M2 may be coupled to the second terminal of the second magnetic tunnel junction memory cell MTJ_b, the second terminal of the second transistor M2 may be coupled to the source line SL, and the control terminal of the first transistor M1 may be coupled to the word line WL. The first input terminal of the sensing amplifier SA may be coupled to the first bit line BL, the second input terminal of the sensing amplifier SA may be coupled to the second bit line BL_b, and the output terminal thereof may output a readout signal OUT.

For example, the first transistor M1 and the second transistor M2 may be MOS transistors.

In one embodiment, when programming the first magnetic tunnel junction memory cell MTJ, both the first transistor M1 and the second transistor M2 may be in conduction, and the current flowing through the first magnetic tunnel junction memory cell MTJ may increase, thereby improving the programming capability of the magnetic tunnel junction memory cell.

In unlimiting embodiments of the present disclosure, referring to FIG. 2, the magnetic memory may further include a first charging capacitor C1 and a second charging capacitor C2. The first terminal of the first charging capacitor C1 may be grounded, and the second terminal of the first charging capacitor C1 may be coupled to the first terminal of the first magnetic tunnel junction memory cell MTJ. The first terminal of the second charging capacitor C2 may be grounded, and the second terminal of the second charging capacitor C2 may be coupled to the first terminal of the second magnetic tunnel junction memory cell MTJ_b.

In one embodiment, the first charging capacitor C1 and the second charging capacitor C2 may be used to charge the first bit line BL and the second bit line BL_b.

Figure 3:
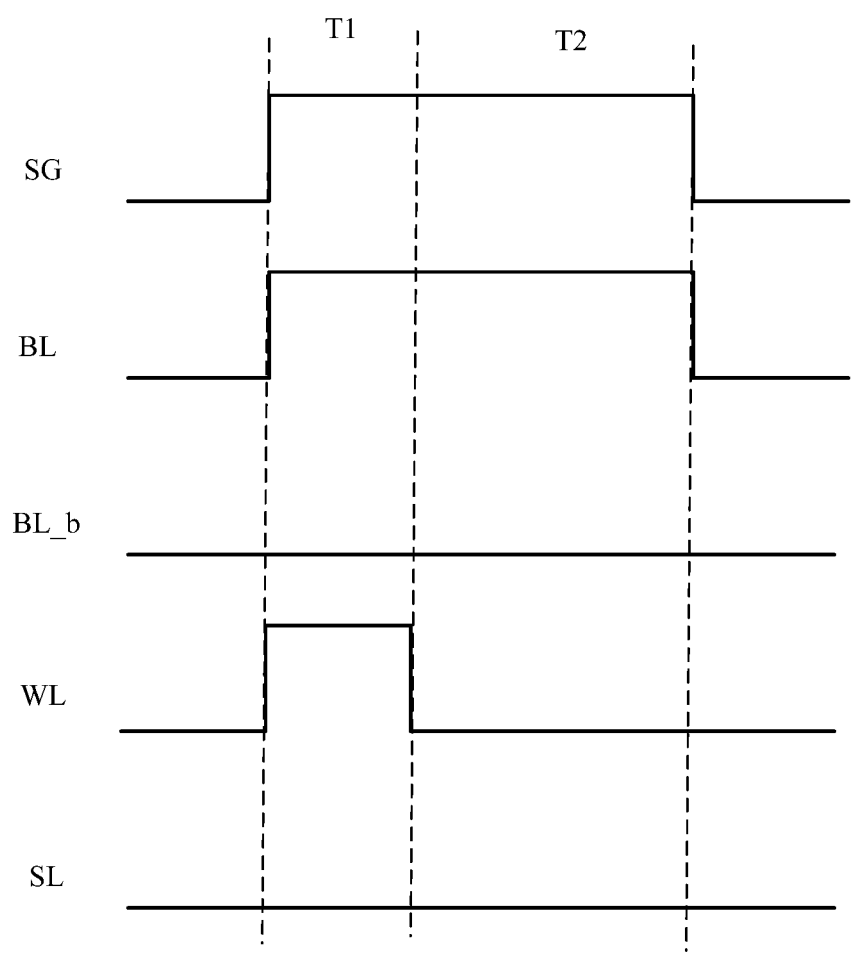
FIG. 3 illustrates a time sequence signal schematic according to various disclosed embodiments of the present disclosure.

Referring to FIGS. 3-4, the programming control method based on the magnetic memory may include the following steps.

At step S401, when writing 0, a positive voltage is applied on the first bit line and a ground voltage is applied on the second bit line.

At step S402, at an initial programming stage, the switch control signal may be used to control the switch device to be in conduction, and the word line may be used to control the first transistor and the second transistor to be in conduction, thereby switching the first magnetic tunnel junction memory cell into the low resistance state.

At step S403, at a second programming stage, the word line may be used to control the first transistor and the second transistor to be cutoff, thereby switching the second magnetic tunnel junction memory cell into the high resistance state.

The control process for writing 0 to the magnetic memory may be shown in one embodiment.

By applying the positive voltage on the firs bit line BL and the ground voltage on the second bit line BL_b, the current direction may be achieved from the first terminal to the second terminal of the first magnetic tunnel junction memory cell MTJ and also from the second terminal to the first terminal of the second magnetic tunnel junction memory cell MTJ_b, thereby achieving different resistance states of the first magnetic tunnel junction memory cell MTJ and the second magnetic tunnel junction memory cell MTJ_b.

At the initial programming stage, that is, the T1 stage shown in FIG. 3, the switch control signal SG may be a high level to control the switch device M0 to be in conduction; and simultaneously, the word line WL may also be the high level to control the first transistor M1 and the second transistor M2 to be in conduction. At this point, a current path may be formed, the free magnetization layer of the first magnetic tunnel junction memory cell MTJ may be reversed, and the first magnetic tunnel junction memory cell MTJ may be switched to the low resistance state.

At the second programming stage, that is, the T2 stage shown in FIG. 3, the switch control signal SG may be the high level to control the switch device M0 to be in conduction; and simultaneously, the word line WL may be a low level to control the first transistor M1 and the second transistor M2 to be cutoff. At this point, the current may flow from the first bit line BL to the second bit line BL_b through the first magnetic tunnel junction memory cell MTJ, the switch device M0, and the second magnetic tunnel junction memory cell MTJ_b. The free magnetization layer of the second magnetic tunnel junction memory cell MTJ_b may be reversed; and the inversion direction of the second magnetic tunnel junction memory cell MTJ_b may be opposite to the inversion direction of the first magnetic tunnel junction memory cell MTJ. The second magnetic tunnel junction memory cell MTJ_b may be switched to the high resistance state.

Referring to FIG. 5, the programming control method based on the magnetic memory may include the following steps.

At step S501, when writing 1, the ground voltage is applied on the first bit line and the positive voltage is applied on the second bit line.

At step S502, at the initial programming stage, the switch control signal may be used to control the switch device to be in conduction, and the word line may be used to control the first transistor and the second transistor to be in conduction, thereby switching the first magnetic tunnel junction memory cell into the high resistance state.

At step S503, at the second programming stage, the word line may be used to control the first transistor and the second transistor to be cutoff, thereby switching the second magnetic tunnel junction memory cell into the low resistance state.

Different from the above-mentioned embodiments, the control process for writing 0 to the magnetic memory may be shown in one embodiment.

Different from the above-mentioned embodiments, the ground voltage may be applied on the first bit line and the positive voltage may be applied on the second bit line when writing 1.

The implementation processes of step S502 and step S503 may be same as the implementation process of step S402 and step S403 shown in FIG. 4. Different from the above-mentioned step S402 and step S403, the first magnetic tunnel junction memory cell MTJ may be switched to the high resistance state, and the second magnetic tunnel junction memory cell MTJ_b may be switched to the low resistance state in one embodiment.

Figure 6:
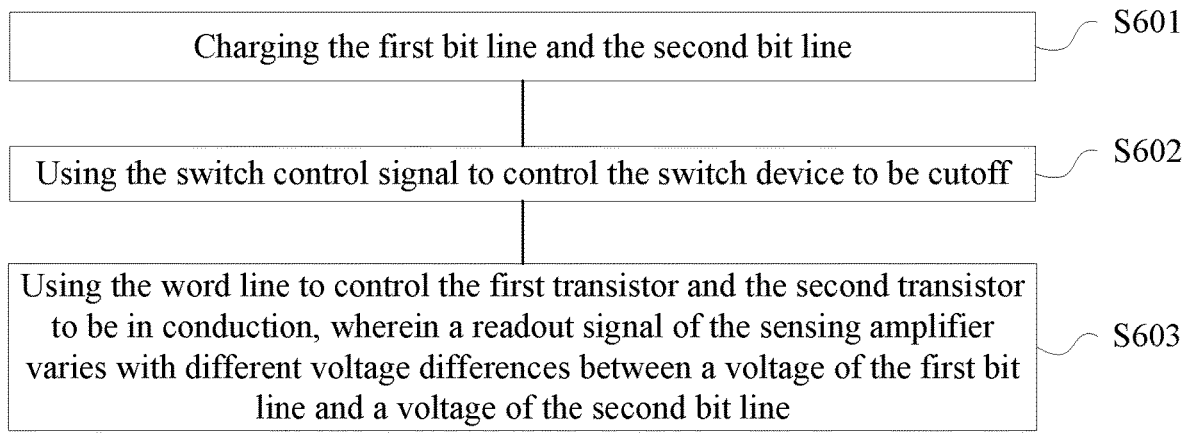
FIG. 6 illustrates a flow chart of a reading method according to various disclosed embodiments of the present disclosure.

Referring to FIG. 6, the reading method based on the magnetic memory may include the following steps.

At S601, the first bit line and the second bit line may be charged.

At S602, the switch control signal may be used to control the switch device to be cutoff.

At S603, the word line may be used to control the first transistor and the second transistor to be in conduction, and the readout signal of the sensing amplifier may vary with the voltage differences between the voltage of the first bit line and the voltage of the second bit line.

In one embodiment, after the magnetic memory is written with 0 or 1, the resistance states of the first magnetic tunnel junction memory cell MTJ and the second magnetic tunnel junction memory cell MTJ_b may be different, and the resistance states of the first magnetic tunnel junction memory unit MTJ and the second magnetic tunnel junction memory unit MTJ_b their selves after writing 0 and 1 may also different. Therefore, when reading data from the magnetic memory, the discharge rates of the first magnetic tunnel junction memory cell MTJ and the second magnetic tunnel junction memory cell MTJ_b may be different, and the voltage differences between the voltage of the first bit line BL and the voltage of the second bit line BL_b may be different when the magnetic memory is written with 0 and 1. In such way, whether the data stored in the magnetic memory is 0 or 1 may be determined by the voltage differences between the voltage of the first bit line BL and the voltage of the second bit line BL_b.

For example, the voltage differences between the voltage of the first bit line BL and the voltage of the second bit line BL_b may be computed by inputting the voltage of the first bit line BL and the voltage of the second bit line BL_b into the sensing amplifier SA.

Figure 1:
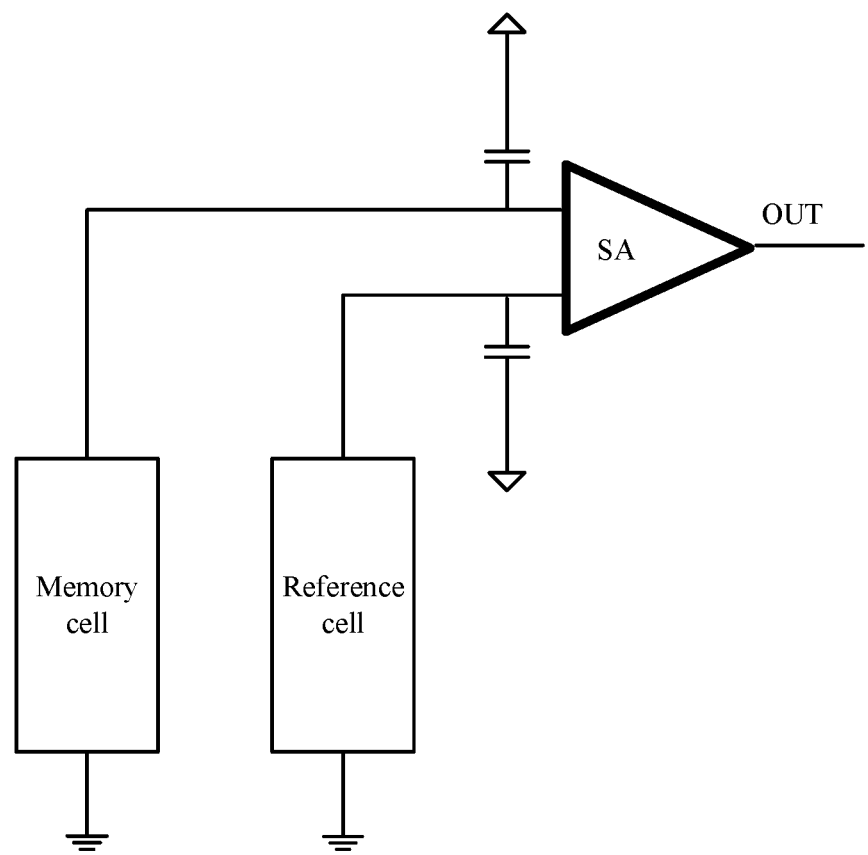
FIG. 1 illustrates a circuit structural diagram of a magnetic memory in the existing technology.

For more details on the working principles and working methods of the programming method and the reading method, reference may be made to the related descriptions in FIGS. 1-3, which may not be described in detail herein.

Figure 7:
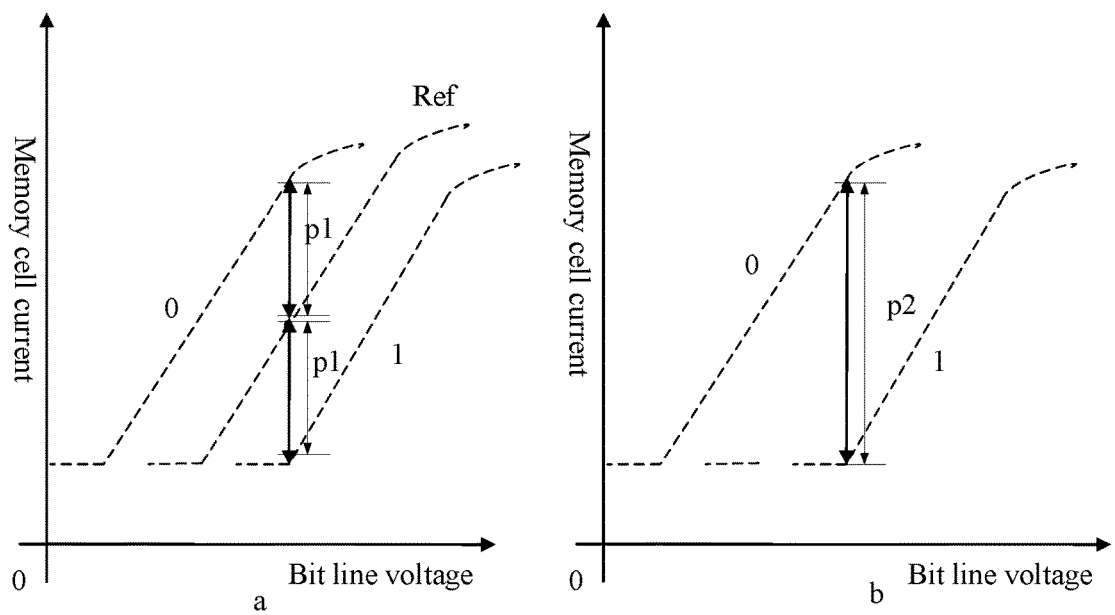
FIG. 7 illustrates a schematic of an application scenario according to various disclosed embodiments of the present disclosure.

Referring to FIG. 7, FIG. 7 illustrates a comparison schematic of the reading window of the magnetic memory of the present application and the reading window of the magnetic memory in the existing technology.

As shown in case a in FIG. 7, since the magnetic memory in the existing technology needs to compare the current of the memory cell with a reference current when reading a signal, the size of the reading window is shown as p1. In the present application, since the comparison of the resistance values of the single magnetic tunnel junction memory cell in the low resistance state and the high resistance state is avoided, the reading window may become larger, as shown as p2 of case b in FIG. 7.

Compared with the existing technology, the reading window for reading information may be increased in the present application, thereby improving the reading accuracy and speed.

The embodiments of the present disclosure also provide a magnetic storage device. The magnetic storage device may include the magnetic memory and a controller. The controller may be configured to perform the steps of the method shown in FIG. 4, 5 or 6.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A magnetic memory, comprising:
a first magnetic tunnel junction memory cell, including a first terminal coupled to a first bit line;
a switch device, including a first terminal coupled to a second terminal of the first magnetic tunnel junction memory cell, and a control terminal connected to a switch control signal;
a second magnetic tunnel junction memory cell, including a first terminal coupled to a second bit line, and a second terminal coupled to a second terminal of the switch device, wherein the switch device is controlled by the switch control signal to be on or off, such that a resistance state of the first magnetic tunnel junction memory cell and a resistance state of the second magnetic tunnel junction memory cell can be switched;
a first transistor, including a first terminal coupled to the second terminal of the first magnetic tunnel junction memory cell, a second terminal coupled to a source line, and a control terminal coupled to a word line;
a second transistor, including a first terminal coupled to the second terminal of the second magnetic tunnel junction memory cell, a second terminal coupled to the source line, and a control terminal coupled to the word line; and
a sensing amplifier, including a first input terminal coupled to the first bit line, a second input terminal coupled to a second bit line, and an output terminal outputting a readout signal.

2. The memory according to claim 1, wherein:
the first terminals of the first magnetic tunnel junction memory cell and the second magnetic tunnel junction memory cell are free magnetization layers, and the second terminals of the first magnetic tunnel junction memory cell and the second magnetic tunnel junction memory cell are fixed magnetization layers.

3. The memory according to claim 1, wherein:
when writing 0 or 1, the first magnetic tunnel junction memory cell and the second magnetic tunnel junction memory cell have different resistance states.

4. The memory according to claim 3, wherein:
after writing 0, the first magnetic tunnel junction memory cell is in a low resistance state, and the second magnetic tunnel junction memory cell is in a high resistance state; and after writing 1, the first magnetic tunnel junction memory cell is in the high resistance state, and the second magnetic tunnel junction memory cell is in the low resistance state; or
after writing 1, the first magnetic tunnel junction memory cell is in the low resistance state, and the second magnetic tunnel junction memory cell is in the high resistance state; and
after writing 0, the first magnetic tunnel junction memory cell is in the high resistance state, and the second magnetic tunnel junction memory cell is in the low resistance state.

5. The memory according to claim 1, further including:
a first charging capacitor, including a first terminal that is grounded, and a second terminal coupled to the first terminal of the first magnetic tunnel junction memory cell; and
a second charging capacitor, including a first terminal that is grounded, and a second terminal coupled to the first terminal of the second magnetic tunnel junction memory cell.

6. The memory according to claim 1, wherein:
the first terminals of the first magnetic tunnel junction memory cell and the second magnetic tunnel junction memory cell are fixed magnetization layers, and the second terminals of the first magnetic tunnel junction memory cell and the second magnetic tunnel junction memory cell are free magnetization layers.

7. The memory according to claim 1, wherein:
each of the first transistor and the second transistor is a metal-oxide-semiconductor transistor.

8. A programming control method of the magnetic memory, the magnetic memory including:
a first magnetic tunnel junction memory cell, including a first terminal coupled to a first bit line;
a switch device, including a first terminal coupled to a second terminal of the first magnetic tunnel junction memory cell, and a control terminal connected to a switch control signal;
a second magnetic tunnel junction memory cell, including a first terminal coupled to a second bit-line, and a second terminal coupled to a second terminal of the switch device, wherein the switch device is controlled by the switch control signal to be on or off, such that a resistance state of the first magnetic tunnel junction memory cell and a resistance state of the second magenetic tunnel junction memory cell can be switched;
a first transistor, including a first terminal coupled to the second terminal of the first magnetic tunnel junction memory cell, a second terminal coupled to a source line, and a control terminal coupled to a word line;
a second transistor, including a first terminal coupled to the second terminal of the second magnetic tunnel junction memory cell, a second terminal coupled to the source line, and a control terminal coupled to the word line; and
a sensing amplifier, including a first input terminal coupled to the first bit line, a second input terminal coupled to a second bit line, and an output terminal outputting a readout signal, wherein the method comprising:
when writing 0, applying a positive voltage on the first bit line and a ground voltage on the second bit line;
at an initial programming stage, using the switch control signal to control the switch device to be in conduction and using the word line to control the first transistor and the second transistor to be in conduction, thereby switching the first magnetic tunnel junction memory cell into a low resistance state; and
at a second programming stage, using the word line to control the first transistor and the second transistor to be cutoff, thereby switching the second magnetic tunnel junction memory cell into a high resistance state.

9. The programming control method of the magnetic memory according to claim 8, the method further comprising:
when writing 1, applying a ground voltage on the first bit line and a positive voltage on the second bit line;

at an initial programming stage, using the switch control signal to control the switch device to be in conduction and using the word line to control the first transistor and the second transistor to be in conduction, thereby switching the first magnetic tunnel junction memory cell into a high resistance state; and at a second programming stage, using the word line to control the first transistor and the second transistor to be cutoff, thereby switching the second magnetic tunnel junction memory cell into a low resistance state.

10. The programming control method of the magnetic memory according to claim 8, the method further comprising:

charging the first bit line and the second bit line;

using the switch control signal to control the switch device to be cutoff; and using the word line to control the first transistor and the second transistor to be in conduction, wherein a readout signal of the sensing amplifier varies with different voltage differences between a voltage of the first bit line and a voltage of the second bit line.

11. A magnetic storage device, comprising:

a magnetic memory, including:

a first magnetic tunnel junction memory cell, including a first terminal coupled to a first bit line;

a switch device, including a first terminal coupled to a second terminal of the first magnetic tunnel junction memory cell, and a control terminal connected to a switch control signal;

a second magnetic tunnel junction memory cell, including a first terminal coupled to a second bit line, and a second terminal coupled to a second terminal of the switch device, wherein the switch device is controlled by the switch control signal to be on or off, such a resistance state of the first magnetic tunnel junction memory cell and a resistance state of the second magenetic tunnel junction memory cell can be switched;

a first transistor, including a first terminal coupled to the second terminal of the first magnetic tunnel junction memory cell, a second terminal coupled to a source line, and a control terminal coupled to a word line;

a second transistor, including a first terminal coupled to the second terminal of the second magnetic tunnel junction memory cell, a second terminal coupled to the source line, and a control terminal coupled to the word line; and a sensing amplifier, including a first input terminal coupled to the first bit line, a second input terminal coupled to a second bit line, and an output terminal outputting a readout signal; and a controller, configured to execute a programming control method and a reading method of the magnetic memory.

* * * * *